(12) United States Patent
Sukkau et al.

(10) Patent No.: US 11,835,604 B2
(45) Date of Patent: Dec. 5, 2023

(54) METHOD FOR ASCERTAINING A POSITION AND/OR AN ORIENTATION OF AN MR LOCAL COIL UNIT

(71) Applicant: Siemens Healthcare GmbH, Erlangen (DE)

(72) Inventors: Johann Sukkau, Herzogenaurach (DE); Volker Matschl, Bamberg (DE); Steffen Schroeter, Fuerth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/873,604

(22) Filed: Jul. 26, 2022

(65) Prior Publication Data
US 2023/0033812 A1 Feb. 2, 2023

(30) Foreign Application Priority Data
Jul. 29, 2021 (DE) ................ 10 2021 208 176.2

(51) Int. Cl.
*G01R 33/34* (2006.01)
*G01R 33/48* (2006.01)

(52) U.S. Cl.
CPC . *G01R 33/34084* (2013.01); *G01R 33/34007* (2013.01); *G01R 33/481* (2013.01)

(58) Field of Classification Search
CPC ........ G01R 33/34084; G01R 33/34007; G01R 33/481; G01R 33/36; G01R 33/341
See application file for complete search history.

(56) References Cited

U.S. PATENT DOCUMENTS

| | | | |
|---|---|---|---|
| 9,638,769 B2 | 5/2017 | Wirtz et al. | |
| 10,393,829 B2 | 8/2019 | Ludwig et al. | |
| 2006/0047196 A1* | 3/2006 | Katzenelson | G01R 33/285 |
| | | | 600/410 |

(Continued)

FOREIGN PATENT DOCUMENTS

DE 102016203255 A1 8/2017

OTHER PUBLICATIONS

Zijlstra, F. et al.:"Fast Fourier-based simulation of off-resonance artifacts in steady-state gradient echo MRI applied to metal object localization," Magnetic Resonance in Medicine 78, 2035-2041 (Nov. 2017).

(Continued)

*Primary Examiner* — G. M. A Hyder
(74) *Attorney, Agent, or Firm* — Harness, Dickey & Pierce, P.L.C.

(57) ABSTRACT

A method for ascertaining at least one of a position or an orientation of an MR local coil unit for arrangement inside a main magnetic field includes providing a first 3D relative position of a reference sensor system in relation to the main magnetic field; receiving an acceleration vector from at least one acceleration sensor; retrieving a distance vector describing a fixed relative position as a function of the received acceleration vector; calculating a second 3D relative position of the at least one acceleration sensor in relation to the main magnetic field based on the first 3D relative position and the retrieved distance vector; and ascertaining the at least one of the position or the orientation of the MR local coil unit using the first 3D relative position and the second 3D relative position.

20 Claims, 5 Drawing Sheets

(56) References Cited

U.S. PATENT DOCUMENTS

| | | | |
|---|---|---|---|
| 2014/0171784 A1* | 6/2014 | Ooi | A61B 5/1114 |
| | | | 600/414 |
| 2016/0161577 A1 | 6/2016 | Taracila et al. | |
| 2017/0065830 A1* | 3/2017 | Vahala | G01R 33/4808 |
| 2021/0158563 A1* | 5/2021 | Rinck | G06T 7/70 |

OTHER PUBLICATIONS

Fischer, Carl et al: SLAM for pedestrians and ultrasonic landmarks in emergency response scenario2; In: Advances in Computers, Elsevier; Year: 2011, pp. 103-160.

Paulus, H. Daniel et al. Simultaneous PET/MR imaging: MR-based attenuation correction of local radiofrequency surface coils; Medical physics; Year: 2012, vol. 39, No. 7, Part1, pp. 4306-4315.

Zijlstra F. et al.:"SMART tracking: Simultaneous anatomical imaging and real-time passive device tracking for MR-guided interventions", arXiv:1908.10769v1 [physics.med-ph] Aug. 28, 2019.

Frohwein, J. Lynn et al: "PET attenuation correction for flexible MRI surface coils in hybrid PET/MRI using a 30 depth camera"; Physics in Medicine & Biology; Year: 2018, vol. 63, No. 2, p. 025033.

* cited by examiner

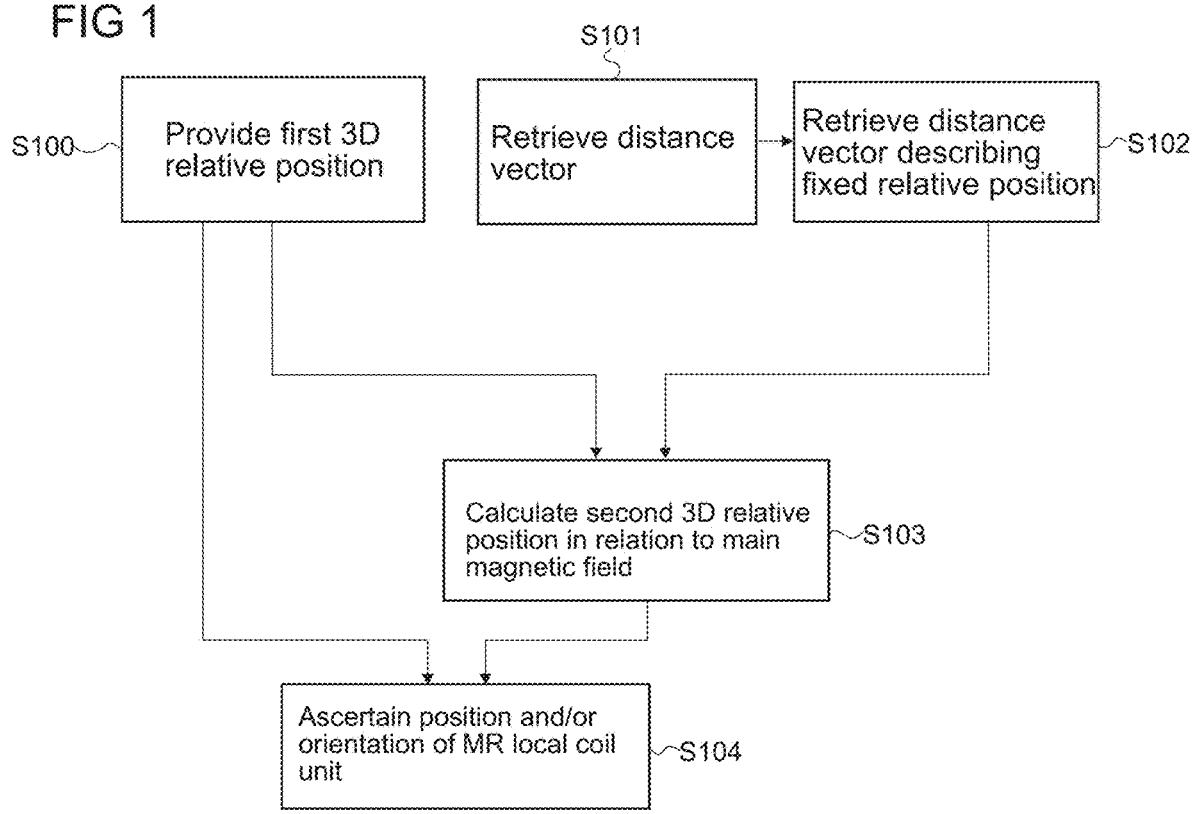
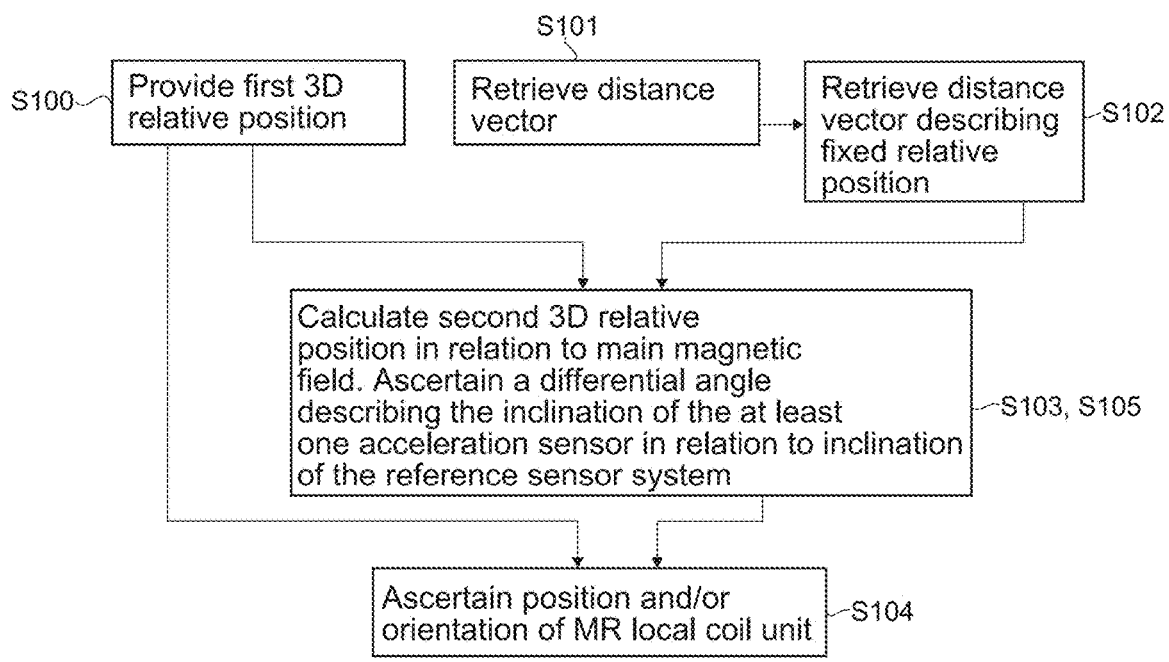

METHOD FOR ASCERTAINING A POSITION AND/OR AN ORIENTATION OF AN MR LOCAL COIL UNIT

CROSS-REFERENCE TO RELATED APPLICATION(S)

The present application claims priority under 35 U.S.C. § 119 to German Patent Application No. DE 102021208176.2, filed Jul. 29, 2021, the entire contents of which are incorporated herein by reference.

FIELD

Some example embodiments of the present invention relate to a method for ascertaining a position and/or an orientation of an MR local coil unit, to the MR local coil unit, to a magnetic resonance tomography system, to an MR-PET imaging system and to an associated computer program product.

BACKGROUND

For magnetic resonance imaging (MR imaging), also called magnetic resonance tomography, an examination object, for example a patient, is arranged inside a main magnetic field of a magnetic resonance tomography system. During the MR imaging the main magnetic field is overlaid with gradient coils for spatial encoding to be able to three-dimensionally allocate MR signals excited in the examination object and emitted by it, so a 3D-image of the examination object can be reconstructed.

The emitted MR signals are typically received by coil elements attached directly to the examination object. An MR local coil unit with such coil elements is typically fixed relative to the examination object, although its position in relation to the main magnetic field is initially unknown.

In particular with a combination of the MR imaging with positron emission tomography inside an MR-PET imaging system, the information about the position and/or orientation of the MR local coil unit is advantageous, because a PET signal can be attenuated when it penetrates the MR local coil unit. The more coil elements or (other electronic devices) are provided in the MR local coil unit, the greater the attenuation can be.

From the prior art such methods are generally known which subsequently correct the attenuation in permanently installed MR coil units. For this, an attenuation map is created for example by means of a computed tomograph. By means of the attenuation map and the flight direction of the gamma quanta representing the PET signals, the attenuation of the PET signals can be calculated and optionally corrected.

With MR local coil units it is, by contrast, particularly challenging to ascertain the position and/or the orientation thereof for the calculation of the attenuation map because the MR local coil unit can typically be flexibly and/or arbitrarily arranged on or at the examination object.

This challenge has already been addressed in the prior art as follows, for example in that markers installed in the MR local coil unit are detected in MR and/or PET imaging and thus render the MR local coil unit visible. Alternatively, active or passive optical markers can be used on the coil surface, which render the coil surface visible for 3D or 2D cameras in visible or infrared light. One possibility for determining the position of an apparatus which can be flexibly arranged inside a main magnetic field by means of a position marker is described in U.S. Pat. No. 9,638,769 B2. US 2014/171 784 A1 discloses wireless markers with a predefined relative position to each other for movement detection and correction in MR imaging. Zijlstra, F. et al. describe in "Fast Fourier-based simulation of off-resonance artifacts in steady-state gradient echo MRI applied to metal object localization," Magnetic Resonance in Medicine 78, 2035-2041 (November 2017) a method for localizing metal objects.

The position of an MR local coil unit can also be ascertained by means of a reference sensor system, as described in DE 10 2016 203 255 A1, for which at least one sensor (for example a Hall sensor and/or an ultrasound sensor and/or an inclination sensor) is provided in the MR local coil unit. DE 10 2016 203 255 A1 discloses in particular a method and an apparatus and a magnetic resonance tomograph for determining a position of the apparatus on the z-coordinate axis relative to a B0 field magnet of the magnetic resonance tomograph. The z-coordinate axis is defined by an axis of symmetry of the B0 field magnet in the preferred direction of the B0-field. The apparatus has a magnetic field strength sensor arranged on the apparatus in a fixed relative position.

The solution described in DE 10 2016 203 255 A1 requires a relatively large number of complex sensors, which makes it possible to ascertain the position of the MR local coil unit but can be comparatively cost-intensive as a result.

SUMMARY

Some example embodiments disclose a method for ascertaining a position and/or an orientation of an MR local coil unit, the MR local coil unit, a magnetic resonance tomography system, an MR-PET imaging system and an associated computer program product, which is technically less complex.

According to at least one example embodiment, a method for ascertaining at least one of a position or an orientation of an MR local coil unit for arrangement inside a main magnetic field of a magnetic resonance tomography system, wherein the MR local coil unit has at least one coil element, a reference sensor system and at least one acceleration sensor spaced apart from the reference sensor system in a fixed relative position, the method includes providing a first 3D relative position of the reference sensor system in relation to the main magnetic field; receiving an acceleration vector from the at least one acceleration sensor; retrieving a distance vector describing the fixed relative position as a function of the received acceleration vector; calculating a second 3D relative position of the at least one acceleration sensor in relation to the main magnetic field based on the first 3D relative position and the retrieved distance vector; and ascertaining the at least one of the position or the orientation of the MR local coil unit using the first 3D relative position and the second 3D relative position.

According to an example embodiment, the calculating is further based on a correction value, the correction value at least partially compensating for a curvature of the MR local coil unit between the at least one acceleration sensor and the reference sensor system.

According to an example embodiment, correction value is generated from an artificial system after its learning phase by a learning transfer.

According to an example embodiment, the method further includes providing the correction value for a learning phase of an artificial system after calculating the second 3D relative position.

According to an example embodiment, the method further includes ascertaining a differential angle describing the inclination of the at least one acceleration sensor in relation to the inclination of the reference sensor system, the ascertaining being performed during the calculating the second 3D relative position.

According to an example embodiment, the method further includes undershooting a threshold value of at least one of (i) the at least one acceleration sensor or (ii) the reference sensor system; and measuring the acceleration vector before the receiving the acceleration vector and after the undershooting a threshold value.

According to an example embodiment, the method further includes providing a stoppage signal of a patient couch, the MR local coil unit being on the patient couch; and measuring the acceleration vector before the receiving the acceleration vector and after the providing the stoppage signal.

According to an example embodiment, the method further includes measuring the acceleration vector before the receiving the acceleration vector and after arranging the MR local coil unit inside the main magnetic field.

According to an example embodiment, the method further includes measuring the acceleration vector before the receiving the acceleration vector and after a defined period.

According to an example embodiment, the method further includes moving a patient couch into the main magnetic field after the providing the first 3D relative position and before the receiving the acceleration vector, the MR local coil unit being on the patient couch.

According to an example embodiment, the method further includes calculating an attenuation map of the MR local coil unit using the at least one of the ascertained position or the orientation of the MR local coil unit, the calculating the attenuation map being performed after the ascertaining the at least one of the position or the orientation of the MR local coil unit.

According to an example embodiment, an MR local coil unit comprises a computing unit configured to perform a method according to example embodiments; the at least one coil element; and the reference sensor system.

According to an example embodiment, a magnetic resonance tomography system includes the MR local coil unit; and a main magnet configured to provide the main magnetic field, wherein the MR local coil unit is inside the main magnetic field.

According to an example embodiment, an MR-PET imaging system includes the magnetic resonance tomography system; and a positron emission tomography system.

According to an example embodiment, a computer-readable medium has a computer program product that, when executed by a computing unit, is configured to cause the computing unit to perform a method according to example embodiments.

BRIEF DESCRIPTION OF THE DRAWINGS

Some example embodiments of the invention will be described and explained in more detail below with reference to the exemplary embodiments illustrated in the figures. Basically, substantially constant structures and units will be labeled with the same reference numerals as in the case of the first occurrence of the respective structure or unit in the following description of the figures.

In the drawings:

FIG. 1 shows a method for ascertaining a position and/or an orientation of a MR local coil unit according to an example embodiment, FIG. 2 shows an example embodiment of the inventive method.

DETAILED DESCRIPTION

Figure 3:
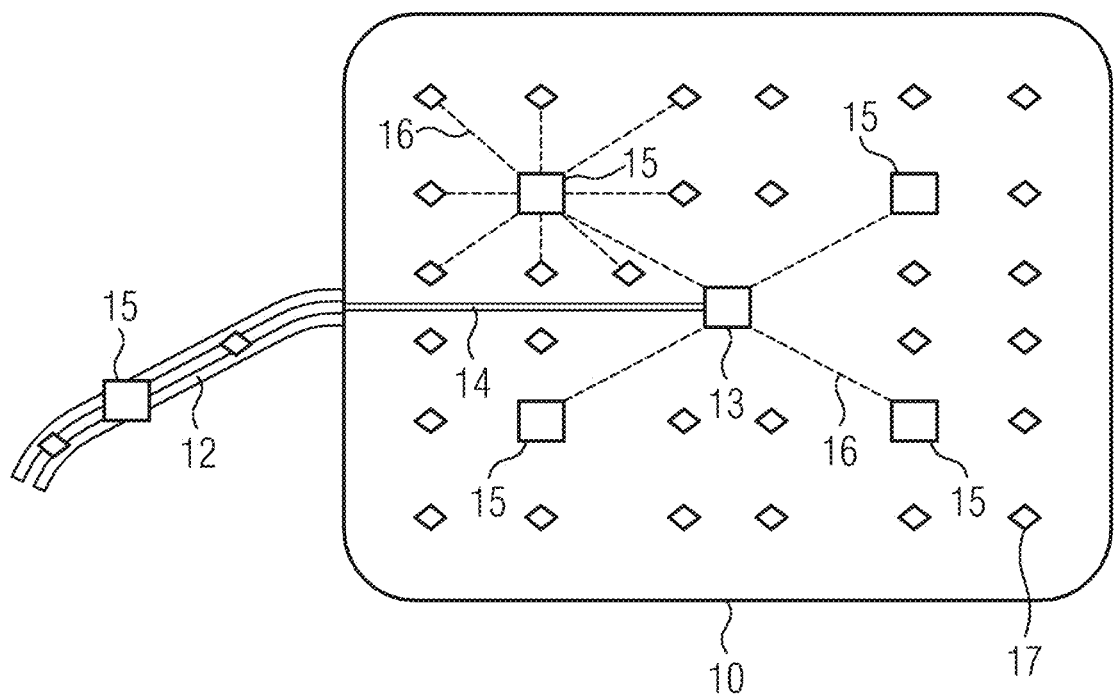
FIG. 3 shows an MR local coil unit according to an example embodiment.

An inventive method for ascertaining a position and/or an orientation of a MR local coil unit for arrangement inside a main magnetic field of a magnetic resonance tomography system, wherein the MR local coil unit has at least one coil element, a reference sensor system and at least one acceleration sensor spaced apart from the reference sensor system in a fixed relative position, comprises the following steps:

providing a first 3D relative position of the reference sensor system in relation to the main magnetic field, receiving an acceleration vector from the at least one acceleration sensor, retrieving a distance vector describing the fixed relative position as a function of the received acceleration vector from a storage unit, calculating a second 3D relative position of the at least one acceleration sensor in relation to the main magnetic field, wherein the first 3D relative position and the retrieved distance vector are input parameters of the calculation and the second 3D relative position is an output parameter of the calculation, and ascertaining the position and/or the orientation of the MR local coil unit using the first 3D relative position and the second 3D relative position as input parameters.

The method has in particular the following advantages: Compared to the solution described in DE 10 2016 203 255 A1 the second 3D relative position can be calculated without a comparatively complex sensor, in particular a further reference sensor system with, for example, a Hall sensor, being provided at this location. The second 3D relative position is therefore ascertained in particular as a function of the first 3D relative position, and this is made possible in particular by the at least one acceleration sensor. The at least one acceleration sensor can replace the further reference sensor system, in particular owing to the inventive mode of calculation of the second 3D relative position as a function of the first 3D relative position. Typically a Hall sensor and an inclination sensor is combined in the reference sensor system. The omission of the further reference sensor system due to the replacement with the at least one acceleration sensor thus reduces the degree of technical complexity overall, which must otherwise be provided as part of the MR coil unit in accordance with the prior art, whereby example embodiments of the present invention are conventionally accompanied by a cost advantage.

Example embodiments of the present invention are more reliable than an optical method because covering the MR local coil unit, for example with a heated blanket and/or the lateral winding of the MR local coil unit around the surface of the examination object, and thus a potential loss of the line of sight necessary for the optical method, is not a problem. Furthermore, no markers that are potentially damaging to health are provided as part of the MR coil unit. The omission of any markers also has a positive effect on the image quality, since they cannot cause any image artifacts.

Example embodiments can basically take place before, during or after an imaging examination provided that the position and/or orientation of the MR local coil unit relative to the main magnetic field and thus to the magnetic resonance tomography system remains substantially constant for the period of the examination and of example embodiments. The imaging examination comprises, for example, MR imaging in the magnetic resonance tomography system and/or PET imaging in the positron emission tomography system.

The main magnetic field of the magnetic resonance tomography system is regularly referred to as the B0-field. For generating the, in particular, static main magnetic field, the magnetic resonance tomography system has a magnetic unit. Typically the nuclear spins of the examination object are oriented along the axis of symmetry of the magnetic unit in the main magnetic field. The axis of symmetry corresponds, in particular, to a center axis of the patient tunnel of the magnetic resonance tomography system.

The MR local coil unit is typically a surface coil, which for optimizing a signal-to-noise ratio is arranged at an optimally short distance from the examination object. The MR local coil unit is preferably individually positioned at or on the examination object depending on the examination object. Conventionally the MR local coil unit can receive MR signals, which are excited in the examination object. Alternatively or in addition, RF signals can be emitted by the MR local coil unit for exciting the MR signals in the examination object. The MR local coil unit can have a plurality of coil elements as antennas for transmitting RF signals and/or for receiving MR signals. The plurality of coil elements are arranged for example in a matrix in order to allow simultaneous and thus accelerated MR imaging.

The at least one coil element, the reference sensor system and the at least one acceleration sensor are typically permanently installed in the MR local coil unit. Securing in the MR local coil unit means the respective relative positions to each other are typically fixed, that is to say not changeable.

The reference sensor system is in particular designed to provide the first 3D relative position of the reference sensor system as part of the MR coil unit in relation to the main magnetic field in the world coordinate system. The reference sensor system can typically also provide the orientation of the reference sensor system. The first 3D relative position comprises in particular the reference z-coordinate of the reference sensor system. Advantageously, the first 3D relative position also comprises the reference x- and/or reference y-coordinate. The first 3D relative position thus comprises in particular the reference x-y-z-coordinates of the reference sensor system. The orientation of the reference sensor system comprises in particular one, preferably three, solid angles alpha, beta, gamma.

The reference sensor system has in particular a Hall sensor and an orientation sensor for ascertaining the reference z-coordinate, in particular the reference x-y-z-coordinates and/or the three solid angles. The reference sensor system can be designed and/or used for this in accordance with DE 10 2016 203 255 A1. Reference should be made in this regard in particular to the fact that ascertaining the first 3D relative position of the reference sensor system in relation to the main magnetic field can comprise moving the reference sensor system along the axis of symmetry and measuring magnetic field strengths of the main magnetic field. Basically it is conceivable that the first 3D relative position can occur by an optical method, for example a stereoscopic camera, or by a marker-based method.

That the first 3D relative position is provided in relation to the main magnetic field, means, in particular, that with the information from the first 3D relative position it is possible to localize the reference sensor system relative to the and inside of the main magnetic field and thus to the magnetic resonance tomography system. It is known from the prior art, for example from DE 10 2016 203 255 A1, how the first 3D relative position can be used to ascertain the position of the reference sensor system. After the inventive calculation of the second 3D relative position it is accordingly possible, with the information from the second 3D relative position, to localize the at least one acceleration sensor relative to the and inside of the main magnetic field and thus to the magnetic resonance tomography system. The axis of symmetry of the magnetic resonance tomography system can be part of a world coordinate system, which can match a coordinate system of the main magnetic field.

Providing the first 3D relative position can comprise ascertaining the first 3D relative position and/or transferring the first 3D relative position and/or storing the first 3D relative position for retrieving the same. The first 3D relative position can be provided in a computing unit. The first 3D relative position is provided in particular after arranging the MR local coil unit inside the main magnetic field. Inside the main magnetic field conceptually includes, in particular, the region in which the main magnetic field is substantially constant, and the border region in which the main magnetic field increases from more or less zero through to a constant value.

Receiving the acceleration vector from the at least one acceleration sensor comprises in particular measuring the acceleration vector by the at least one acceleration sensor. Measuring can take place in a frequency higher than 0.01 Hz, in particular higher than 1 Hz, preferably higher than 100 Hz. Measuring the acceleration vector can comprise selecting an acceleration vector, in particular a static one, from a large number of measured acceleration vectors. The acceleration vector is typically measured in the world coordinate system. The measured acceleration vector is typically transferred from the at least one acceleration sensor for receiving. Receiving can take place, for example, in the computing unit. After receiving and before calculating the second 3D relative position the acceleration vector can be ascertained, for example, by averaging and/or by filtering and/or by modeling the measured acceleration vectors.

In particular an acceleration vector based on the earth's gravitational axis and projected onto the spatial axes of the world coordinate system is measured by the at least one acceleration sensor. The acceleration vector comprises in particular the measured values $acc\_x$, $acc\_y$, $acc\_z$:

$$acc\_x = 1 \ g \cdot \sin(theta) \cdot \cos(phi)$$

$$acc\_y = -1 \ g \cdot \sin(theta) \cdot \sin(phi)$$

$$acc\_z = 1 \ g \cdot \cos(theta)$$

$$acc\_y / acc\_x = -\tan(phi)$$

From this connection the angles of inclination phi and theta against the earth's gravitational axis can be calculated as follows:

$$theta = a\cos(acc\_z / 1 \ g)$$

$$phi = -a\tan(acc\_y / acc\_x)$$

The angles of inclination phi, theta can be differentiated for example by the terms roll angle and pitch angle and can typically indicate an orientation of the acceleration sensor. Basically these angles theta, phi can be adjusted by plus/minus 90° in order to be able to define with the angles of inclination alpha, beta corresponding thereto a horizontal orientation with 0°. Alpha, beta are based, in particular, on the same spatial axes as theta, phi and optionally have a normalization depending on the type of acceleration sensor and/or measured acceleration sensor.

Inclination exists in particular if the at least one acceleration sensor or the reference sensor system are in each case not horizontally oriented. The inclination can generally be ascertained by the measured values of an acceleration sensor and/or an acceleration vector and/or inclination sensor. The inclination is defined in particular as the inclination in relation to the earth's gravitational axis. In the present application, the term inclination, in contrast to the term curvature, is locally used and differentiated for the respective sensors, while the curvature refers globally to the MR local coil unit.

Providing the acceleration vector can comprise providing the measured values acc_x, acc_y, acc_z and/or the calculated angles of inclination phi, theta. The angle(s) of inclination of the acceleration vector (and thus of the at least one acceleration sensor) describe the orientation of the at least one acceleration sensor in relation to the world coordinate system.

Basically it can be expedient that a coil coordinate system u, v, w different from the world coordinate system x, y, z is used for the MR local coil unit. The coil coordinate system is abbreviated to CCS, and this stands for Coil Coordinate system. A point in the world coordinate system, which indicates, for example, the first 3D relative position or the second 3D relative position, can be transformed into a point in the coil coordinate system, for example by a transformation matrix, which describes in particular a translation and/or rotation, and vice versa. The coil coordinate system of the MR local coil unit can be defined such that the 3D relative position and thus the position of the reference sensor system form the origin of the coil coordinate system. A deviation between the coordinate systems can be reduced for example by the boundary condition that a user orients the MR local coil unit substantially parallel to the patient couch.

The at least one acceleration sensor is arranged spaced apart from the reference sensor system in a fixed relative position. The fixed relative position is maintained for example by a physical connection of the at least one acceleration sensor to the reference sensor system. The physical connection can form a part, in particular a housing, of the MR local coil unit. Depending on the configuration of the physical connection, in particular depending on the degree of elasticity of the physical connection, an absolute distance between the at least one acceleration sensor and the reference sensor system can be variable despite the fixed relative position, for example in that the MR local coil unit is curved.

Curvature is in particular defined in such a way that at least one angle of inclination of the at least one acceleration sensor and at least one angle of inclination of the reference sensor system differ. The curvature follows in particular as a result of the fact that the, for example flat, MR local coil unit is applied with an elastic physical connection around a non-flat surface of the examination object. The curvature is in particular a direct consequence of gravity on the MR local coil unit and/or securing of the MR local coil unit by a coil belt. No patient-dependent curvature is provided with a non-elastic physical connection. The curvature of the MR local coil unit is produced in particular from the angle of inclination of the at least one acceleration sensor typically compared to the angle of inclination of the reference sensor system. If, for example, the reference sensor system is horizontally oriented in accordance with its angle of inclination and there is an inclination in the case of at least one acceleration sensor, the MR local coil unit is curved therebetween at least in certain sections.

The input parameter acceleration vector makes it possible to find to what extent the at least one acceleration sensor is arranged at the same height compared to the reference sensor system. In other words, whether the at least one acceleration vector and the reference sensor system substantially experience the same amount of acceleration due to gravity. Für this comparison of acceleration due to gravity it can be advantageous if, in addition to the first 3D relative position, the orientation is provided in the form of the angle of inclination of the reference sensor system.

The distance vector mathematically maps the distance set up in the fixed relative position preferably in the coil coordinate system u, v, w ab, with the vector extending from the at least one acceleration sensor to the reference sensor system, or vice versa. The distance vector thus indicates in particular a value of the distance and the, for example two-dimensional in relation to u, v or three-dimensional in relation to u, v, w, direction between the at least one acceleration vector and the reference sensor system (or vice versa). The w-coordinate varies typically as a function of the received acceleration vector to take account of the effect of the curvature. The distance vector provided in the storage unit does not take account of the reduction in the distance resulting due to the curvature.

The distance vector is retrieved as a function of the received acceleration vector in such a way that the retrieved distance vector is the curvature-dependent distance vector. Owing to the fixed relative position the curvature-dependent distance vector is preferably unchanging and can therefore be provided in the storage unit.

The storage unit preferably contains at least one distance vector for each acceleration sensor. Typically the storage unit contains one curvature-dependent distance vector each for one curvature each of the at least one acceleration sensor. Alternatively, the curvature-dependent distance vector can be calculated as a function of the acceleration vector, in particular of the angle of inclination, from an uncurved distance vector, for example assuming that the distance and the two-dimensional direction u, v is identical and a rotation takes place about the angle of inclination against the earth's gravitational axis. The curvature-dependent distance vector can be calculated in the computing unit. The step of taking into account gravity and thus the curvature can alternatively take place when calculating the second 3D relative position.

The distance vector is regularly stored in a storage unit for retrieving. Retrieving takes place in particular by way of the computing unit. The storage unit can be the main memory of the computing unit or a different memory, in particular read only. The distance vector is in particular not ascertained only after the MR local coil unit has been arranged inside the main magnetic field. The distance vector is conventionally ascertained before the arrangement of the MR local coil unit inside the main magnetic field, for example by a manufacturer or user of the MR local coil unit.

The second 3D relative position is produced in particular by addition of the first 3D relative position and the distance vector. Mathematically, an operation of this kind can demand a multiplication. For this it can basically be expedient to carry out the calculation at least partially in the world coordinate system and at least partially in the coil coordinate system. The distance vector defines the difference between the vector from the second 3D relative position and the vector from the first 3D relative position. One possible calculation formula shall be reproduced by way of example below, taking into account the different coordinate systems:

$T_{world}$ = first 3D relative position $= (x, y, z)_{world}, (alpha_0, beta_0, gamma_0)_{world}$ The received acceleration vector produces $=(alpha,beta)_{world}$ From this it follows in the coil coordinate system:

$(alpha,beta)_{ccs}=(alpha,beta)_{world}-(alpha_0,beta_0)_{world}$

Alternatively, the inclination in accordance with $(alpha, beta)_{ccs}$ in 2D will be considered below:

$P_u$=rotation$_v$(alpha)·distance vector=$(u1,0,wu)$ $P_v$=rotation$_u$(beta)·distance vector=$(0,v1,wv)$ where rotation or rotation$_u$ describe a rotation about the v- or u-axis.

Inventively, the calculation of the second 3D relative position produces:

$P_{ccs}$ = second 3D relative position in the coil coordinate system $= (u1, v1, \mathrm{MINIMUM}(wu, wv))$ The minimum value of wu, wv is used if by definition the w-axis points upwards, while the MR local coil unit is curved downwards with an angle of inclination greater than 0'.

$P_{world}$ = second 3D relative position in the world coordinate syster $= T_{world} + \mathrm{rotation}\,(alpha_0, beta_0, gamma_0)_{world} \cdot P_{ccs}$ The second 3D relative position is calculated in particular in the computing unit using program code means. The program code means maps a formula with the input parameters. The input parameters of the calculation, after the calculation, produce the second 3D relative position. It is conceivable that the formula has intermediate steps for the preparation of individual or all input parameters.

The position and/or the orientation of the MR local coil unit is ascertained in particular in the computing unit. The position and/or the orientation describe in particular a 3D-orientation of the MR local coil unit in relation to the main magnetic field in the world coordinate system. In other words, due to the ascertained position and/or orientation, the coordinates of at least two elements, in particular support points of the MR local coil unit, in particular of the reference sensor system and of the at least one acceleration sensor spaced apart in a fixed relative position, in relation to the main magnetic field are advantageously known. Using the first 3D relative position and the second 3D relative position as input parameters, the position and/or the orientation of the MR local coil unit can be ascertained in particular in accordance with a support point-based and/or other model-based and/or numerical method known from the prior art.

One embodiment provides that when calculating the second 3D relative position, a differential angle describing the inclination of the at least one acceleration sensor in relation to the inclination of the reference sensor system is ascertained. This embodiment makes it possible in particular to ascertain to what extent the reference sensor system and/or the at least one acceleration sensor are not oriented substantially identically, and this can be due to an elongated orientation of the MR local coil unit. Advantageously, it is possible to decide as a function of the differential angle whether a curvature relevant to the next embodiment exists. An elastic physical connection is conceivable for example and thus the MR local coil unit is elongated and not curved if the respective angles of inclination are identical and/or not-horizontal, with the differential angle thus being zero. In other words, both the reference sensor system and the at least one acceleration sensor, can be inclined relative to the world coordinate system, in particular at the same angle of inclination, but it is possible for the MR local coil unit to not be curved.

One embodiment provides that a further input parameter of the calculation of the second 3D relative position is a correction value at least partially compensating the curvature of the MR local coil unit between the at least one acceleration sensor and the reference sensor system, and which is retrieved from a storage unit for calculating the second 3D relative position as a function of the received acceleration vector. The correction value is typically all the greater, the more pronounced the curvature is. If the MR local coil unit is not curved, the correction value is in particular zero. The correction value reduces in particular the value of the distance vector. The storage unit can have an allocation table in which in each case a particular correction value is allocated to different acceleration vectors and/or their angle of inclination. The correction value can already have been allocated to the distance vector in the storage unit. The second 3D relative position is offset in particular with the correction value in such a way that the second 3D relative position moves closer to the first 3D relative position.

One embodiment provides that the correction value is generated by a learning transfer from an artificial system after its learning phase and is thereafter provided in the storage unit for retrieving. This embodiment is advantageous in particular because the artificial system is advantageously already adjusted to a wide variety of embodiments of the MR local coil unit or comparable MR local coil units, and thus the correction value can compensate the actual curvature of the MR local coil unit more exactly. The artificial system can comprise a statistical model, which has been constructed in accordance with machine learning, or an artificial neural network, which has been trained with appropriate training data. After the learning phase of the artificial system means that the statistical model has already been constructed or the artificial neural network has already been trained when the correction value is generated. Generating by the learning transfer means that the correction value is not acquired on the basis of the actual embodiment of the MR local coil unit, in particular not on the basis of the actual curvature, for example by a camera, but is approximated by the artificial system on the basis of the previously described input parameters. In this embodiment, for example the artificial system can be mapped in program code means of the computing unit. The computing unit generates, for example as a function of the acceleration vector, the correction value and/or buffers the generated correction value at least in the main memory, for example in that the computing unit assigns the correction value to a variable.

One embodiment provides that the correction value is provided, after calculating the second 3D relative position, for a learning phase of a artificial system. The learning phase of the artificial system can comprise an adjustment of the statistical model or an edge weight in the artificial neural network. This embodiment is advantageous in particular because the artificial system can learn continuously accordingly.

One embodiment provides that the acceleration vector is measured before receiving the acceleration vector and after undershooting of a threshold value of the at least one acceleration sensor and/or of the reference sensor system. Measuring of the acceleration vector can be repeated, in particular can take place continuously. The threshold value can be based on the value of the acceleration vector or individual or a combination of the measured values acc_x, acc_y, acc_z. If the acceleration vector and/or the measured values acc_x, acc_y, acc_z undershoot the threshold value, they (or a further measured acceleration vector later and/or further measured values measured later) are preferably provided in such a way as a static acceleration vector for the step of receiving. Undershooting of the threshold value can comprise normalizing of successive acceleration vectors, for example by forming a differential value and/or a mean and/or median as a reference value and/or comparing with the reference value. Basically it is conceivable that, in addition or as an alternative, overshooting of a further threshold value is checked. In particular, the threshold value can define an interval in which the MR local coil unit is static by definition. The advantage of this embodiment is that the calculation of the second 3D relative position is more accurate if the MR local coil unit is substantially static. Substantially static means that the MR local coil unit is not moved. This embodiment advantageously ensures a static state of the MR local coil unit when measuring the acceleration vector, in particular the measured values acc_x, acc_y, acc_z.

One embodiment provides that a stoppage signal of a patient couch, on which the MR local coil unit is directly or indirectly arranged, is provided and the acceleration vector is measured before receiving the acceleration vector and after providing the stoppage signal. This embodiment likewise advantageously ensures the static state of the MR local coil unit when measuring the acceleration vector, in particular the measured values acc_x, acc_y, acc_z. The stoppage signal can be provided for example by a control unit of the patient couch if moving of the patient couch is concluded. The MR local coil unit is directly arranged on the patient couch for example if the MR local coil unit is arranged between the patient couch and the examination object. The MR local coil unit is indirectly arranged on the patient couch for example if the MR local coil unit is arranged on the examination object, so the examination object is arranged between the MR local coil unit and the patient couch.

One embodiment provides that the acceleration vector is measured before receiving the acceleration vector and after arranging the MR local coil unit inside the main magnetic field. Arranging the MR local coil unit inside the main magnetic field is advantageous because the first 3D relative position is regularly ascertained after the arrangement of the reference sensor system. As stated in relation to the previous embodiment, arranging can be a direct or indirect arrangement in relation to the patient couch.

One embodiment provides that the acceleration vector is measured before receiving the acceleration vector and after the expiry of a predefinable period. This embodiment likewise advantageously ensures the static state of the MR local coil unit when measuring the acceleration vector, in particular the measured values acc_x, acc_y, acc_z. This embodiment is based on the assumption that the examination object rests quietly during the predefinable period.

One embodiment provides that after providing the first 3D relative position and before receiving the acceleration vector a patient couch, on which the MR local coil unit is arranged directly or indirectly, is moved into the main magnetic field. This embodiment is advantageous in particular because a period in which the MR local coil unit can be moved unintentionally is consequently reduced. This embodiment can be possible in particular with an embodiment of the provision of the first 3D relative position in accordance with DE 10 2016 203 255 A1.

One embodiment provides that after ascertaining the position and/or the orientation of the MR local coil unit, an attenuation map of the MR local coil unit is calculated using the ascertained position and/or the orientation of the MR local coil unit. The attenuation map can be calculated for example in the computing unit. Calculating using the ascertained position and/or the orientation of the MR local coil unit can correspond to correcting an attenuation map. The attenuation map can be what is known as my-Map for PET imaging.

An inventive MR local coil unit has
at least one coil element,
a reference sensor system,
at least one acceleration sensor spaced apart from the reference sensor system in a fixed relative position and
the computing unit. Basically it is conceivable that the MR local coil unit has further reference sensor systems and/or a plurality of acceleration sensors. The MR local coil unit has in particular a large number of acceleration sensors, which are arranged distributed over the housing. The large number is between 3 and 1,000, in particular between 5 and 500, preferably between 10 and 100. The MR local coil unit can have a plurality of reference sensor systems, which together with the large number of acceleration sensors are arranged uniformly distributed over the housing.

An inventive magnetic resonance tomography system has the MR local coil unit and
a main magnet for providing the main magnetic field, wherein the MR local coil unit is arranged inside the main magnetic field. The magnetic resonance tomography system is designed for carrying out the MR imaging and due to the use of the MR local coil unit shares its previously described advantages.

An inventive MR-PET imaging system has
the magnetic resonance tomography system and
a positron emission tomography system. The MR-PET imaging system is designed for carrying out MR imaging and PET imaging and due to the use of the MR local coil unit shares its previously described advantages.

The computer program product can be a computer program or comprise a computer program. The computer program product has in particular the program code means (e.g., code), which map the method steps. As a result, example embodiments can be carried out in a defined and repeatable manner and control is exercised by reproducing a method. The computer program product is preferably configured in such a way that the computing unit can execute the method steps by means of the computer program product. The program code means can be loaded in particular into a memory of the computing unit and are typically executed by a processor of the computing unit with access to the memory. If the computer program product, in particular the program code means, is executed in the computing unit, typically all inventive embodiments of the described method can be carried out. The computer program product is saved for example on a physical, computer-readable medium and/or digitally stored as a data packet in a computer network. The computer program product can constitute the physical, computer-readable medium and/or the data packet in the computer network. Example embodiments of the invention can thus also start from the physical, computer-readable medium and/or the data packet in the computer network. The physical, computer-readable medium can conventionally be directly connected to the computing unit, for example in that the physical, computer-readable medium is inserted in a DVD drive or plugged into a USB port, whereby the computing unit can in particular read access the physical, computer-readable medium. The data packet can preferably be retrieved from the computer network. The computer network can have the computing unit or be indirectly connected by a Wide Area Network (WAN) or a (Wireless) Local Area Network connection (WLAN or LAN) to the computing unit. By way of example, the computer program product can be stored digitally on a Cloud server at a storage location of the computer network, be transferred by the WAN via the Internet and/or by the WLAN or LAN to the computing unit in particular by retrieving a download link, which points to the storage location of the computer program product.

Features, advantages or alternative embodiments mentioned in the description of the apparatus are likewise to be transferred to the method, and vice versa. In other words, claims on the method can be developed with features of the apparatus, and vice versa. In particular, an inventive apparatus can be used in the method.

FIG. 1 shows an inventive method for ascertaining a position and/or an orientation of an MR local coil unit for arrangement inside a main magnetic field of a magnetic resonance tomography system, with the MR local coil unit having at least one coil element, a reference sensor system and at least one acceleration sensor spaced apart from the reference sensor system in a fixed relative position, in a flowchart. The method comprises the following steps S100 to S104:

Method step S100 designates providing a first 3D relative position of the reference sensor system in relation to the main magnetic field.

Method step S101 designates receiving an acceleration vector from the at least one acceleration sensor.

Method step S102 designates retrieving a distance vector describing the fixed relative position as a function of the received acceleration vector from a storage unit.

Method step S103 designates calculating a second 3D relative position of the at least one acceleration sensor in relation to the main magnetic field, wherein the first 3D relative position and the retrieved distance vector are input parameters of the calculation and the second 3D relative position is an output parameter of the calculation.

Method step S104 designates ascertaining the position and/or the orientation of the MR local coil unit using the first 3D relative position and the second 3D relative position as input parameters.

FIG. 2 shows a first exemplary embodiment of the method shown in FIG. 1.

Method step S105 designates that when calculating the second 3D relative position, a differential angle describing the inclination of the at least one acceleration sensor in relation to the inclination of the reference sensor system is ascertained.

FIG. 3 shows a plan view of an, in particular not curved, MR local coil unit 10. The MR local coil unit 10 is designed for arrangement inside a main magnetic field of a magnetic resonance tomography system 20. FIG. 3 does not show the at least one coil element of the MR local coil unit 10.

The MR local coil unit 10 in this exemplary embodiment shows a coil cable 12. Alternatively a wireless transfer of the signals to and from the MR local coil unit 10 can be provided. A sensor signal, for example of the measured acceleration vector, can be transferred via a data bus 14, which is designed in particular in accordance with a I2C and/or SP standard.

The MR local coil unit 10 comprises a reference sensor system 13. In this exemplary embodiment, additional further reference sensor systems 15 are provided and one possible distributed arrangement thereof is illustrated.

Furthermore, the MR local coil unit 10 comprises at least one acceleration sensor 17 spaced apart from the reference sensor system 13 in a fixed relative position. In this exemplary embodiment, a large number of an acceleration sensors is additionally provided, which are arranged distributed over the MR local coil unit 10 and the coil cable 12. The broken lines 16 indicate that the different sensors are interconnected via a further data bus 16 in such a way that the different signals can be transferred to a computing unit (not shown). Instead of the star-shaped topology shown, alternative configurations are of course conceivable.

A computing unit (not shown in FIG. 3) could be provided for example as part of the reference sensor system 13 or in addition to the reference sensor system 13. Basically it is conceivable that the computing unit is provided outside of the main magnetic field in order to reduce possible artifacts.

Figure 4:
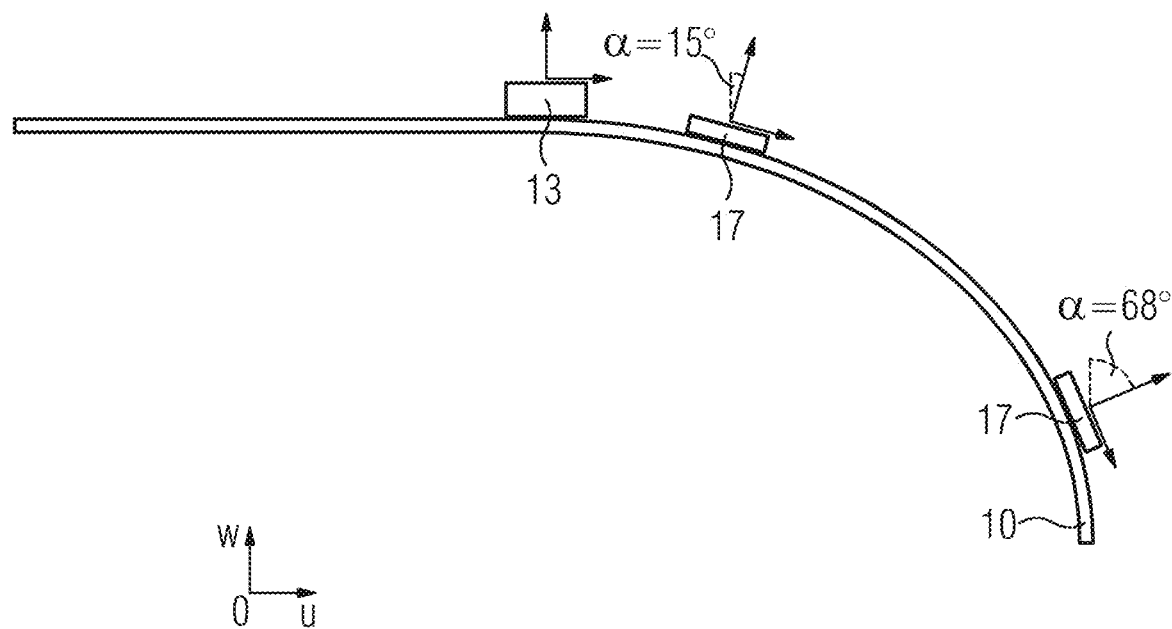
FIG. 4 shows the MR local coil unit in another example embodiment.

FIG. 4 shows the MR local coil unit 10 in a further, curved embodiment. The side view of the MR local coil unit 10 shows the curvature of the MR local coil unit 10 between the at least one acceleration sensor 17 and the reference sensor system 13, for example owing to the non-flat surface of the examination object (not shown), in particular as a consequence of gravity and/or a coil belt with which the MR local coil unit 10 is secured to a patient P (not shown). The reference sensor system 13 is not inclined in this example but horizontally oriented. The at least one acceleration sensor 17 by contrast has an inclination greater than 0', so a curvature of the MR local coil unit 10 exists.

FIG. 4 shows in particular that the distance vector varies depending on the arrangement of the at least one acceleration sensor 17 close to and far from the reference sensor system 13. In addition, a possible degree of curvature correlates with the value of the distance vector.

Furthermore, FIG. 4 shows the angle of inclination alpha of the at least one acceleration sensor 17 at the two positions. In this exemplary embodiment, the coil coordinate system shows earth's gravity along the w-axis.

Figure 5:
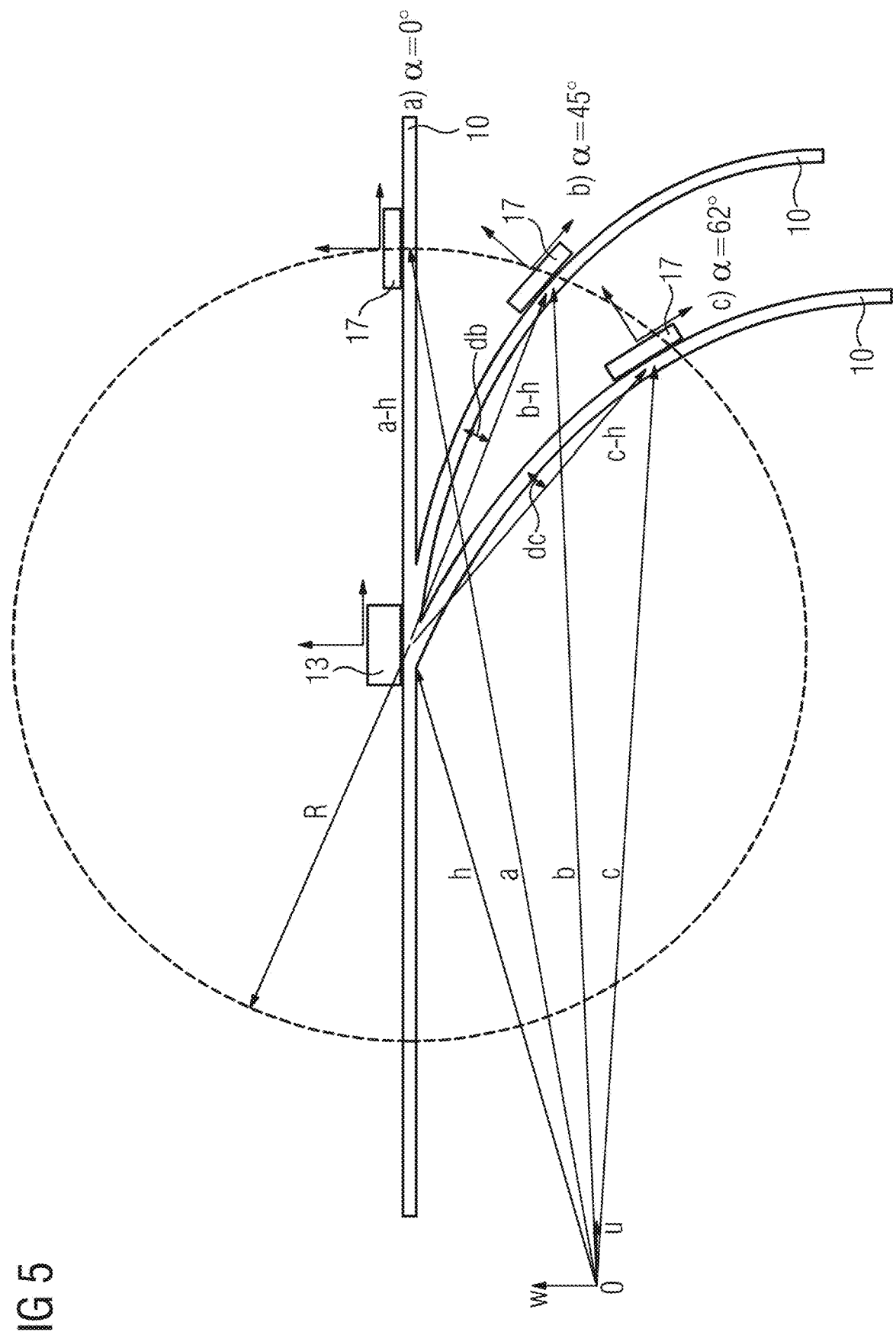
FIG. 5 shows three operating states of the MR local coil unit.

FIG. 5 shows three operating states a), b), c) of the MR local coil unit 10. The three operating states differ in the angle of inclination alpha, where a) alpha=0°, b) alpha=45°, c) alpha=62°. The MR local coil unit 10 is not curved in the operating state a) and is curved in the operating states b), c). Without the shift db and dc in the operating states b), c) caused by the curvature the at least one acceleration sensor 17 is located approximately on the circle with the radius of the value R of the distance of the distance vector. The correction value K provided in some exemplary embodiments serves for correction of this shift db, dc.

The vectors h, a, b, c are indicated in the coil coordinate system. The first 3D relative position is denoted by h and corresponds to $T_{world}$. The second 3D relative position $P_{ccs}$ is denoted as a function of the operating state by a, b, c. The following equations thus result in this simplified two-dimensional case:

$$a=h+(a-h)=h+\text{rotation}(R,0°)$$

Since the inclination is 0° in this case, no correction value owing to a curvature is necessary. The computing unit is preferably designed for such a differentiation of cases.

In the case of curvatures b) and c) with the roll angle of 45° and 62° respectively, owing to db !=0 and dc !=0, the vectors b and c can be calculated only approximately by $$b=h+(b-h)\sim h+\text{rotation}(R,45°)+K \text{ and}$$

$$c=h+(c-h)\sim h+\text{rotation}(R,62°)+K \text{ respectively.}$$

The offsetting of the curvature-dependent correction value K makes it possible to increase the precision in the calculation of the second 3D relative positions b, c.

Figure 6:
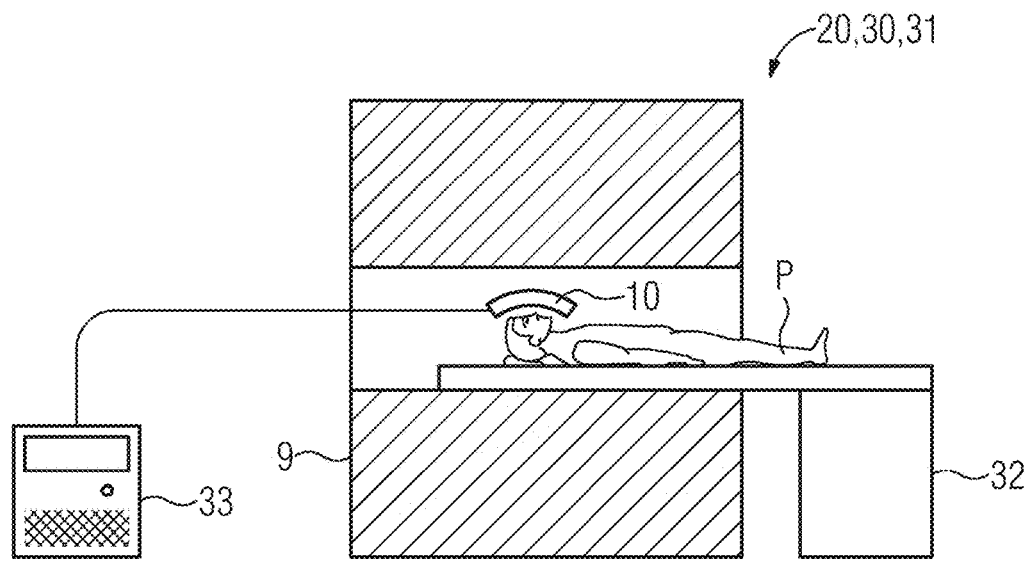
FIG. 6 shows an MR-PET imaging system according to an example embodiment.

FIG. 6 schematically shows an MR-PET imaging system 30.

The MR-PET imaging system 30 has a magnetic resonance tomography system 20 and a positron emission tomography system 31. The magnetic resonance tomography system 20 has an MR local coil unit 10 and a main magnet for providing the main magnetic field, with the MR local coil unit 10 being arranged inside the main magnetic field. When carrying out MR imaging in the MR-PET imaging system 30, the MR signals are detected and when carrying out PET imaging in the MR-PET imaging system 30, the PET signals are detected.

The magnetic resonance tomography system 20 is integrated in the positron emission tomography system 31, and vice versa. The magnetic resonance tomography system 20 and the positron emission tomography system 31 are thus arranged inside a housing G. In this case, MR imaging and PET imaging is possible without significant movement of a patient couch 32 on which a patient P is arranged as an examination object. Alternatively, the two facilities 20, 31 can be arranged in different housings. The housing G has a tunnel-like cavity in which the patient P is arranged for the imaging examination. The MR-PET imaging system 30 has a computing unit 33 for carrying out the above-described method for ascertaining a position and/or an orientation of the MR local coil unit 10.

Figure 7:
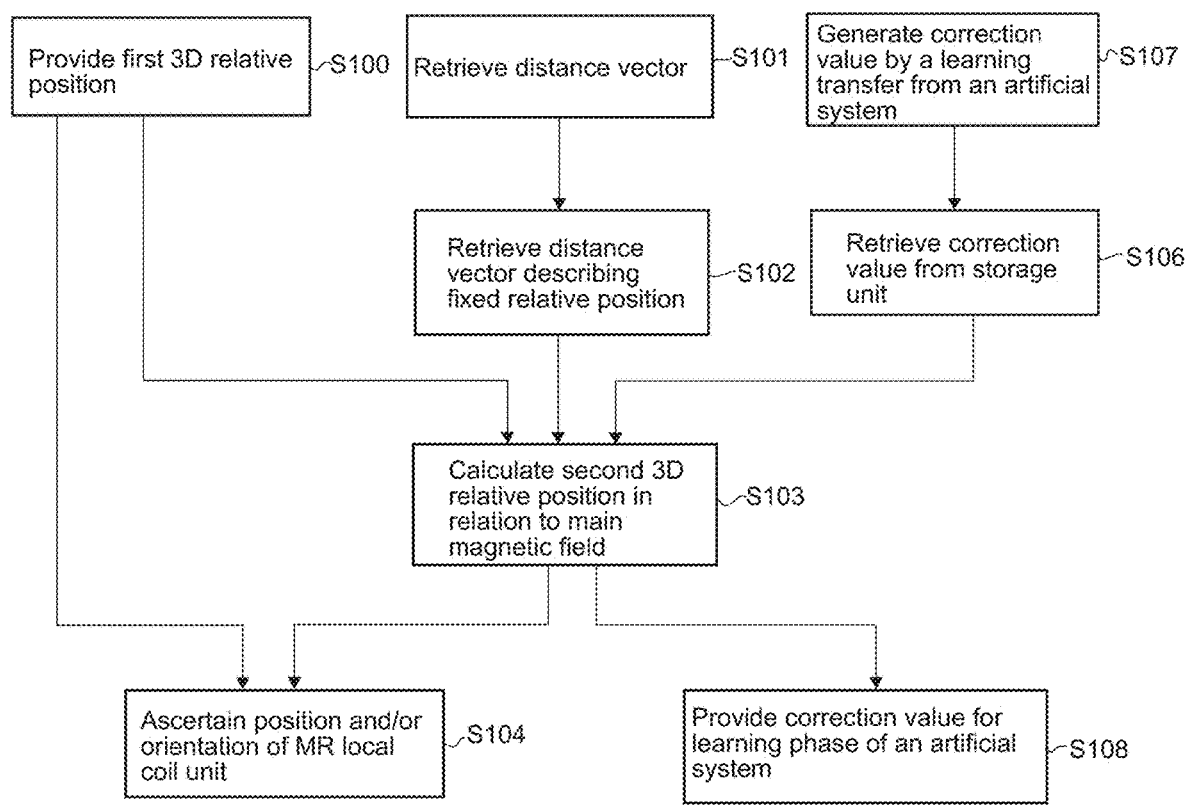
FIG. 7 shows another example embodiment of the inventive method.

FIG. 7 shows a second exemplary embodiment of the method shown in FIG. 1.

Method step S106 designates that a further input parameter of the calculation of the second 3D relative position is a correction value at least partially compensating the curvature of the MR local coil unit between the at least one acceleration sensor and the reference sensor system, which value is retrieved from a storage unit for calculating the second 3D relative position as a function of the received acceleration vector.

Method step S107 designates that the correction value is generated by a learning transfer from an artificial system after its learning phase and is thereafter provided in the storage unit for retrieving.

The optional method step S108 designates that the correction value is provided for a learning phase of an artificial system after calculating the second 3D relative position.

Figure 8:
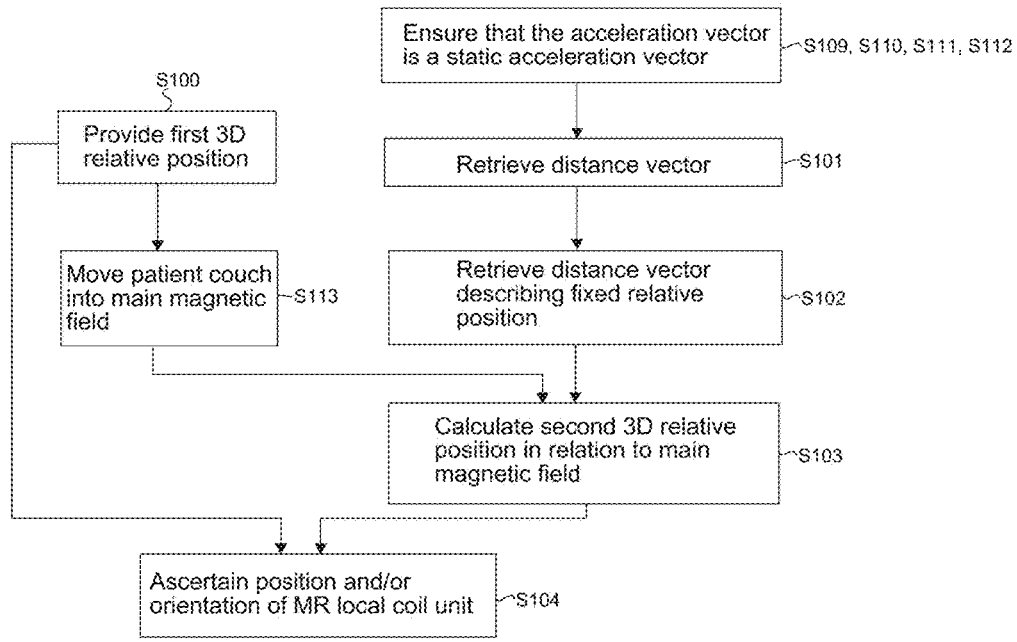
FIG. 8 shows another example embodiment of the inventive method.

FIG. 8 shows a third exemplary embodiment of the method shown in FIG. 1.

Method steps S109 to S112 comprise different variants, which individually or (at least partially) combined ensure that the acceleration vector used for the calculation is a static acceleration vector because the MR local coil unit is not moved at the measuring instant.

Method step S109 designates that the acceleration vector is measured before receiving the acceleration vector and after undershooting a threshold value of the at least one acceleration sensor and/or the reference sensor system.

Method step S110 designates that an stoppage signal of a patient couch, on which the MR local coil unit is directly or indirectly arranged, is provided and the acceleration vector is measured before receiving the acceleration vector and after providing the stoppage signal.

Method step S111 designates that the acceleration vector is measured before receiving the acceleration vector and after arranging the MR local coil unit inside the main magnetic field.

Method step S112 designates that the acceleration vector is measured before receiving the acceleration vector and after a predefinable period has expired.

Method step S113 designates that after providing the first 3D relative position and before receiving the acceleration vector, a patient couch, on which the MR local coil unit is directly or indirectly arranged, is moved into the main magnetic field.

Figure 9:
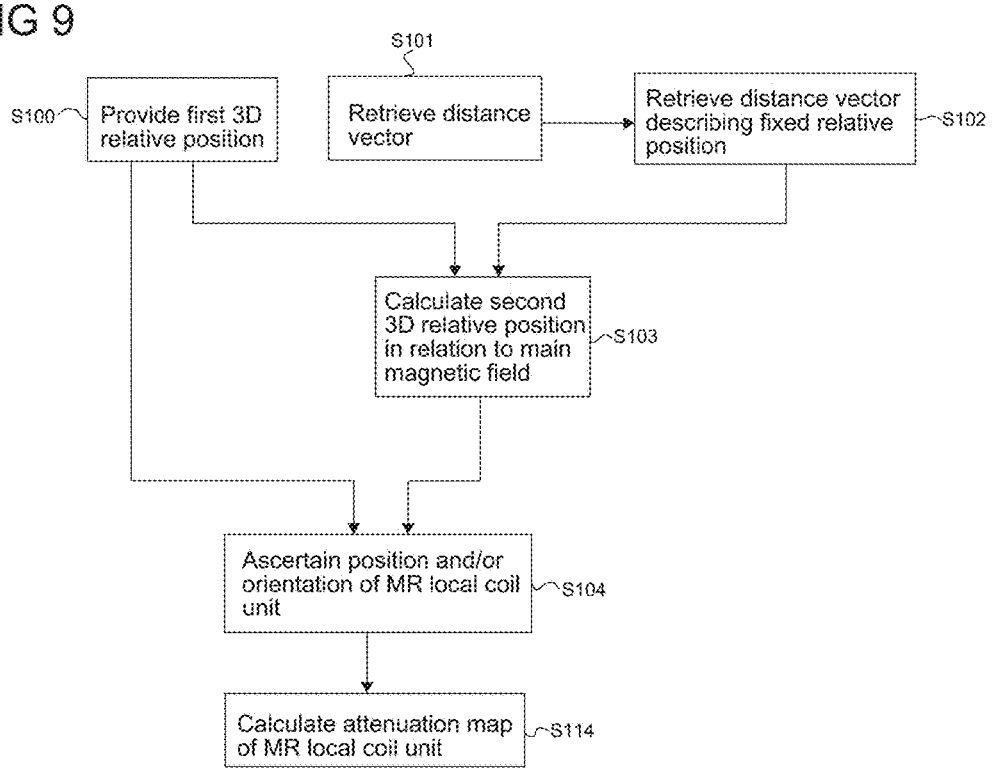
FIG. 9 shows another example embodiment of the inventive method.

FIG. 9 shows a fourth exemplary embodiment of the method shown in FIG. 1.

Method step S114 designates that after ascertaining the position and/or the orientation of the MR local coil unit, an attenuation map of the MR local coil unit is calculated using the ascertained position and/or the orientation of the MR local coil unit.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "on," "connected," "engaged," "interfaced," and "coupled." Unless explicitly described as being "direct," when a relationship between first and second elements is described in the disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" on, connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed above. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. The present invention may, however, be embodied in many alternate forms and should not be construed as limited to only the embodiments set forth herein.

In addition, or alternative, to that discussed above, units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/ hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing system or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although example embodiments of the present invention have been illustrated and described in detail by the preferred exemplary embodiments, it is nevertheless not limited by the disclosed examples and a person skilled in the art can derive other variations herefrom without departing from the scope of the invention.

The invention claimed is:

1. A method for ascertaining at least one of a position or an orientation of an MR local coil unit for arrangement inside a main magnetic field of a magnetic resonance tomography system, wherein the MR local coil unit has at least one coil element, a reference sensor system and at least one acceleration sensor spaced apart from the reference sensor system in a fixed relative position, the method comprising:
providing a first 3D relative position of the reference sensor system in relation to the main magnetic field;
receiving an acceleration vector from the at least one acceleration sensor;
retrieving a distance vector describing the fixed relative position as a function of the received acceleration vector;
calculating a second 3D relative position of the at least one acceleration sensor in relation to the main magnetic field based on the first 3D relative position and the retrieved distance vector; and
ascertaining the at least one of the position or the orientation of the MR local coil unit using the first 3D relative position and the second 3D relative position.

2. The method as claimed in claim 1, wherein the calculating is further based on a correction value, the correction value at least partially compensating for a curvature of the MR local coil unit between the at least one acceleration sensor and the reference sensor system.

3. The method as claimed in claim 2, further comprising:
providing the correction value for a learning phase of an artificial system after calculating the second 3D relative position.

4. The method as claimed in claim 2, further comprising:
ascertaining a differential angle describing the inclination of the at least one acceleration sensor in relation to the inclination of the reference sensor system, the ascertaining being performed during the calculating the second 3D relative position.

5. The method as claimed in claim 2, further comprising:
calculating an attenuation map of the MR local coil unit using the at least one of the ascertained position or the orientation of the MR local coil unit, the calculating the attenuation map being performed after the ascertaining the at least one of the position or the orientation of the MR local coil unit.

6. The method as claimed in claim 2, wherein the correction value is generated from an artificial system after a learning phase by a learning transfer.

7. The method as claimed in claim 6, further comprising:
providing the correction value for the learning phase of the artificial system after calculating the second 3D relative position.

8. The method as claimed in claim 6, further comprising:
ascertaining a differential angle describing the inclination of the at least one acceleration sensor in relation to the inclination of the reference sensor system, the ascertaining being performed during the calculating the second 3D relative position.

9. The method as claimed in claim 6, further comprising:
calculating an attenuation map of the MR local coil unit using the at least one of the ascertained position or the orientation of the MR local coil unit, the calculating the attenuation map being performed after the ascertaining the at least one of the position or the orientation of the MR local coil unit.

10. The method as claimed in claim 1, further comprising:
ascertaining a differential angle describing the inclination of the at least one acceleration sensor in relation to the inclination of the reference sensor system, the ascertaining the differential angle being performed during the calculating the second 3D relative position.

11. The method as claimed in claim 1, further comprising:
undershooting a threshold value of at least one of (i) the at least one acceleration sensor or (ii) the reference sensor system; and
measuring the acceleration vector before the receiving the acceleration vector and after the undershooting the threshold value.

12. The method as claimed in claim 1, further comprising:
providing a stoppage signal of a patient couch, the MR local coil unit being on the patient couch; and
measuring the acceleration vector before the receiving the acceleration vector and after the providing the stoppage signal.

13. The method as claimed in claim 1, further comprising:
measuring the acceleration vector before the receiving the acceleration vector and after arranging the MR local coil unit inside the main magnetic field.

14. The method as claimed in claim 1, further comprising:
measuring the acceleration vector before the receiving the acceleration vector and after a defined period.

15. The method as claimed in claim 1, further comprising:
moving a patient couch into the main magnetic field after the providing the first 3D relative position and before the receiving the acceleration vector, the MR local coil unit being on the patient couch.

16. The method as claimed in claim 1, further comprising:
calculating an attenuation map of the MR local coil unit using the at least one of the ascertained position or the orientation of the MR local coil unit, the calculating the attenuation map being performed after the ascertaining the at least one of the position or the orientation of the MR local coil unit.

17. An MR local coil unit comprising:
a computing unit configured to perform the method as claimed in claim 1;
the at least one coil element; and
the reference sensor system.

18. A magnetic resonance tomography system comprising:
the MR local coil unit as claimed in claim 17; and
a main magnet configured to provide the main magnetic field, wherein the MR local coil unit is inside the main magnetic field.

19. An MR-PET imaging system comprising:
the magnetic resonance tomography system as claimed in claim 18; and
a positron emission tomography system.

20. A non-transitory computer-readable medium having a computer program product that, when executed by a computing unit, is configured to cause the computing unit to perform the method of claim 1.

* * * * *